US008013513B2

(12) United States Patent
Sagawa et al.

(10) Patent No.: US 8,013,513 B2
(45) Date of Patent: Sep. 6, 2011

(54) ACTIVE MATRIX DISPLAY DEVICE (75) Inventors: Hiroshi Sagawa, Kanagawa (JP);
Tetsuro Yamamoto, Kanagawa (JP);
Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 337 days.

(21) Appl. No.: 12/270,929

(22) Filed: Nov. 14, 2008

(65) Prior Publication Data

US 2009/0128027 A1 May 21, 2009

(30) Foreign Application Priority Data

Nov. 19, 2007 (JP) ................................ 2007-299623

(51) Int. Cl.
*H01L 51/52* (2006.01)
(52) U.S. Cl. ........................................ 313/500; 313/506
(58) Field of Classification Search .................... 257/40,
257/72, 98–100, 642–643, 759; 313/498–512;
315/169.1, 169.3; 427/58, 64, 66, 532–535,
427/539; 428/690–691, 917; 438/26–29,
438/34, 82, 455; 445/24–25
See application file for complete search history.

(56) References Cited

U.S. PATENT DOCUMENTS

| 7,291,973 | B2 * | 11/2007 | Ishihara et al. ............... 313/505 |
| 2005/0179374 | A1 * | 8/2005 | Kwak ........................... 313/506 |
| 2007/0247064 | A1 * | 10/2007 | Hosokawa .................... 313/504 |

FOREIGN PATENT DOCUMENTS

| JP | 2000-241833 | 9/2000 |
| JP | 2001-195008 | 7/2001 |
| JP | 2002-318556 | 10/2002 |
| JP | 2004-031335 | 1/2004 |
| JP | 2004-207217 | 7/2004 |
| JP | 2006-058815 | 3/2006 |
| JP | 2006-113597 | 4/2006 |

OTHER PUBLICATIONS

Japanese Patent Office Action corresponding to Japanese Serial No. 2007-299623 dated Sep. 29, 2009.

* cited by examiner

*Primary Examiner* — Nimeshkumar D Patel
*Assistant Examiner* — Donald L Raleigh
(74) *Attorney, Agent, or Firm* — SNR Denton US LLP

(57) ABSTRACT

An active matrix display device includes a driving section provided on a substrate, an insulating film stacked on the driving section, and light-emitting elements arranged in a matrix on the insulating film, each of the light-emitting elements having a light-emitting layer between upper and lower electrodes, the active matrix display device being driven by the driving section provided for each of the light-emitting elements, the active matrix display device also includes an auxiliary wiring provided on the same layer as the lower electrode of the light-emitting element and adapted to adjust the electrical resistance of the upper electrode, and drive wirings disposed in the underlying layer of the auxiliary wiring via the insulating film and adapted to drive the light-emitting element, wherein the auxiliary or drive wiring is routed in a roundabout manner where the auxiliary and drive wirings overlap.

5 Claims, 7 Drawing Sheets

ACTIVE MATRIX DISPLAY DEVICE

CROSS REFERENCES TO RELATED APPLICATIONS

The present invention contains subject matter related to Japanese Patent Application JP 2007-299623 filed in the Japan Patent Office on Nov. 19, 2007, the entire contents of which being incorporated herein by reference.

BACKGROUND OF THE INVENTION

1. Field of the Invention

The present invention relates to an active matrix display device having light-emitting elements arranged in a matrix which are driven by driving means provided for each of the light-emitting elements. The present invention relates more particularly to a technique for providing improved yield of an active matrix display device.

An organic EL display device using organic electroluminescence elements (hereinafter referred to as organic EL elements) as its light-emitting elements has been known as a self-luminous active matrix display device. Such an organic EL element has an organic substance layer between its anode and cathode electrodes. The organic substance layer includes a hole transporting layer and light-emitting layer stacked one upon another. The hole transporting layer and light-emitting layer include an organic substance. The organic substance layer emits light as electrons and holes are injected into this layer as a result of application of a voltage thereto. An organic EL display has organic EL elements arranged in a matrix and driving means for each of the organic EL elements.

Figure 6:
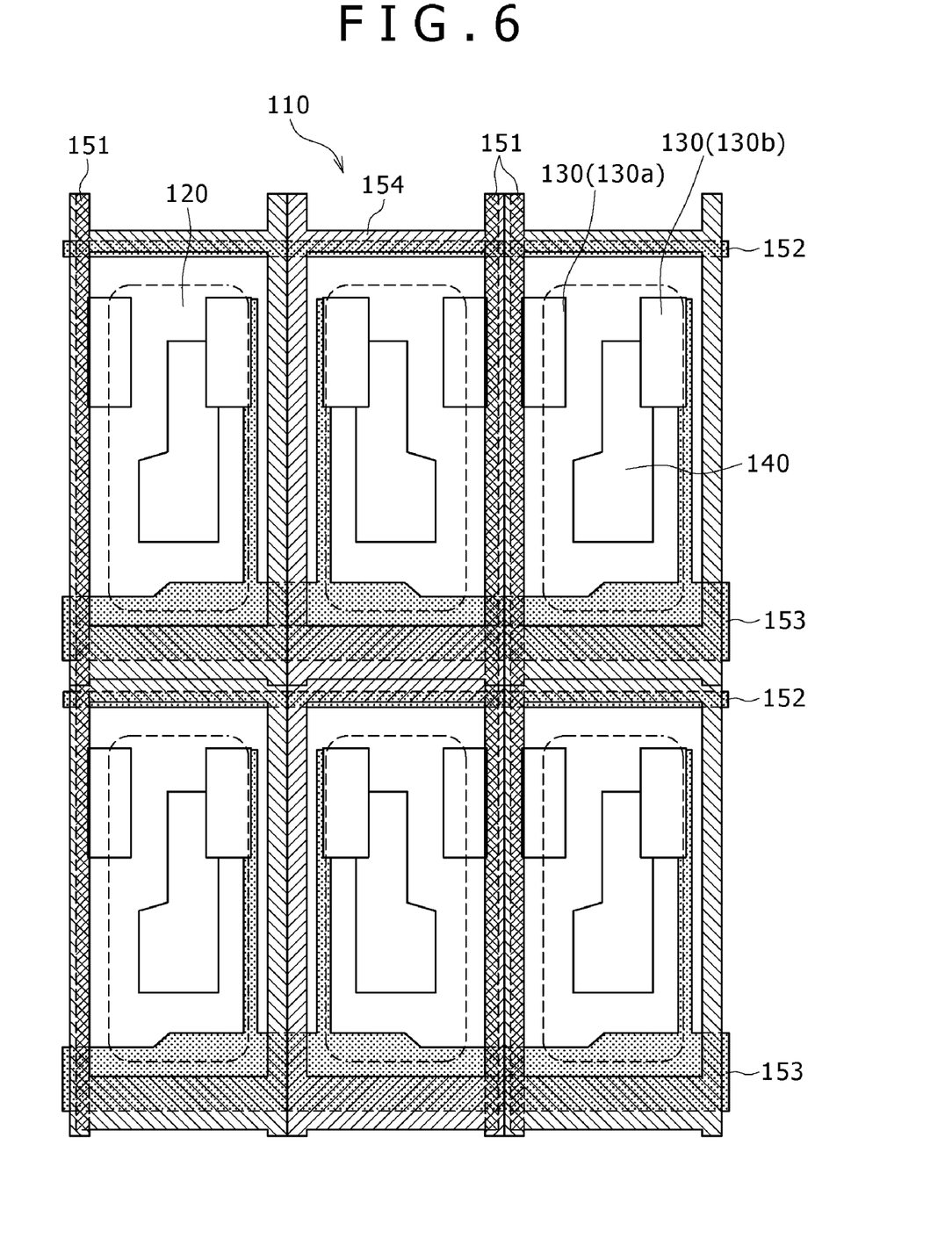
FIG. 6 is a plan view illustrating a reference example of the wiring structure of the organic EL display.

FIG. 6 is a plan view illustrating a reference example of wiring structure of an organic EL display 110.

Figure 7:
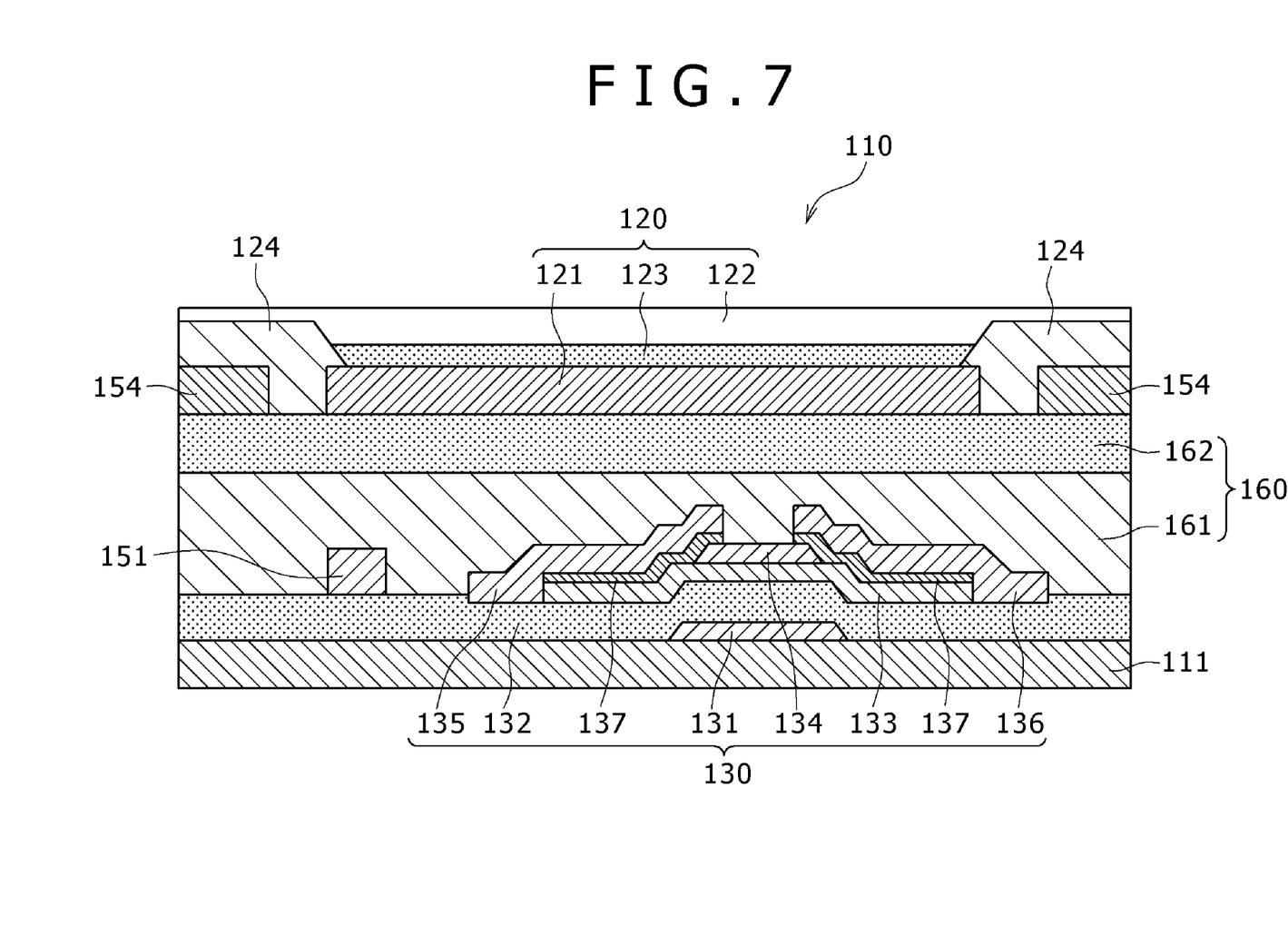
FIG. 7 is a sectional view of the organic EL display illustrated in FIG. 6 in the row direction (horizontal direction in FIG. 6).

FIG. 7 is a sectional view of the organic EL display 110 shown in FIG. 6 in the row direction (horizontal direction in FIG. 6).

As illustrated in FIG. 6, the organic EL display 110 has organic EL elements 120 arranged in a matrix of m rows by n columns (two rows by three columns in FIG. 6 for simplification).

Here, the organic EL display 110 has TFTs (thin film transistors) 130 (TFT 130a and TFT 130b), capacitor (capacitive element) 140 and other components on a substrate 111 (refer to FIG. 7). On the other hand, each of the TFTs 130 includes, as illustrated in FIG. 7, a gate insulating film 132, a-Si (amorphous silicon) layer and protective film 134 stacked on a gate electrode 131. The TFT 130 also includes a source electrode 135 on the left side of the a-Si layer 133 and a drain electrode on the right side thereof. It should be noted that an n+ a-Si layer 137 is provided to ensure excellent ohmic contact between the a-Si layer 133 and source electrode 135 or drain electrode 136.

On the other hand, a signal line 151 is disposed on the gate insulating film 132. The signal line 151 is one of the drive wirings adapted to drive the organic EL element 120. An insulating film 160 is stacked above the TFT 130 and signal line 151. The insulating film 160 includes an insulating protective film 161 and insulating planarizing film 162. The insulating planarizing film 162 has a flat surface free from irregularities. It should be noted that the drive wirings include not only the signal line 151 but also a scan line 152 and power line 153 as illustrated in FIG. 6. These wirings are disposed in the insulating film 160.

Still further, the organic EL element 120 is disposed on the insulating planarizing film 162 illustrated in FIG. 7. The same element 120 has an organic substance layer 123 between an anode electrode and cathode electrode 122. The anode electrode 121 is connected to the TFT 130 via a connection hole (not shown) formed in the insulating film 160. It should be noted that the organic substance layer 123 includes an organic substance adapted to emit light as a result of the recombination of injected electrons and holes.

Still further, the cathode electrode 122 is a transparent electrode. Therefore, light emitted by the organic substance layer 123 is extracted from the center portion of an opening regulating insulating film 124 surrounding the anode electrode 121. That is, the organic EL display 110 as illustrated in FIGS. 6 and 7 is a top emission display designed to extract light from the side opposite to the substrate 111.

Incidentally, the top emission organic EL display 110 uses a transparent electrode as the cathode electrode 122 as described above so that light emitted by the organic substance layer 123 can be extracted. However, a conductive material having a high transmittance is high in resistance. On the other hand, a metal having a high reflectance, for example, is used for the anode electrode 121 on the side of the substrate 111. Therefore, an auxiliary wiring 154 is disposed around the anode electrode 121 and connected to the cathode electrode 122 to reduce the resistance of the same electrode 122.

The auxiliary wiring 154 is provided on the same layer as the anode electrode 121 as illustrated in FIG. 7. The same wiring 154 overlaps the signal line 151 one above the other. As illustrated in FIG. 6, the auxiliary wiring 154 also overlaps the scan and power lines 152 and 153 one above the other. The scan and power lines 152 and 153 are each disposed for each row of the organic EL elements 120. The auxiliary wiring 154 is insulated from the signal, scan and power lines 151, 152 and 153 by the insulating film 160 (refer to FIG. 7).

However, the entry of a foreign object, for example, in the manufacturing process may lead to a short circuit, resulting in a lower yield. A possible solution to this would be to prevent the auxiliary wiring 154 from overlapping the signal line 151 or other lines by reducing the width of the same wiring 154 or reducing the area over which the same wiring 154 is disposed. This solution, however, leads to a voltage drop across the auxiliary wiring 154, resulting in crosstalk.

For this reason, a matrix-wired substrate is known which permits repair of a short circuit. That is, this technique forms a pair of openings in advance in an interlayer insulating film so that the intersection is sandwiched between gate and drain lines. The drain line crosses over the gate line. The interlayer insulating film covers the drain line. The drain line is exposed in the openings. If a short circuit is detected at the intersection between the two lines due to a defect of the interlayer insulating film in the inspection process, the interlayer insulating film is destroyed on the inside (short-circuited side) of each of the pair of openings sandwiching the short-circuited area, after which the drain line beneath the interlayer insulating film is cut off. Then, a bypass line is formed so as to bypass the short-circuited area via the pair of openings, thus rejoin the cut segments of the drain line (refer, for example, to Japanese Patent Laid-Open No. 2000-241833, hereinafter referred to as Patent Document 1).

SUMMARY OF THE INVENTION

However, the technique disclosed in the above patent document 1 simply forms, in advance, a pair of openings on both sides of the intersection where a short circuit is likely to develop. A bypass line is formed following a short circuit. This requires a new bypass line formation step. The repair of a short circuit is labor- and time-consuming.

In light of the foregoing, it is desirable to suppress short circuits between the auxiliary wiring and drive wirings (e.g., signal, scan and power lines) which overlap each other without forming a new bypass line so as to provide improved yield.

The present embodiment solves the above problem by the following means.

The embodiment of the present invention is an active matrix display device which includes driving means provided on a substrate and insulating film stacked on the driving means. The display device further includes light-emitting elements arranged in a matrix on the insulating film. Each of the light-emitting elements has a light-emitting layer between its upper and lower electrodes. The display device is driven by the driving means provided for each of the light-emitting elements. The display device is characterized in that it includes auxiliary and drive wirings. The auxiliary wiring is provided on the same layer as the lower electrode of the light-emitting element and adapted to adjust the electrical resistance of the upper electrode. The drive wiring is disposed in the underlying layer of the auxiliary wiring via the insulating film. The drive wiring is adapted to drive the light-emitting element. The auxiliary or drive wiring is routed in a roundabout manner where the auxiliary and drive wirings overlap.

ADVANTAGEOUS EFFECT

The embodiment includes auxiliary and drive wirings. The auxiliary wiring is provided on the same layer as the lower electrode of the light-emitting element. The drive wiring is disposed in the underlying layer of the auxiliary wiring via an insulating film. The auxiliary or drive wiring is routed in a roundabout manner where the auxiliary and drive wirings overlap. The roundabout wiring of the auxiliary or drive wiring ensures reduced overlap between the two wirings.

According to the above embodiment, the auxiliary or drive wiring is routed in a roundabout manner where the auxiliary and drive wirings overlap, thus ensuring reduced overlap between the two wirings. This suppresses development of short circuits caused by the entry of a foreign object in the manufacturing process, thus permitting light emission of all the light-emitting elements arranged in a matrix in an almost positive manner. As a result, the yield of an active matrix display device can be improved.

DETAILED DESCRIPTION OF THE PREFERRED EMBODIMENTS

The preferred embodiments of the present invention will be described below with reference to the accompanying drawings and other supporting materials.

Figure 1:
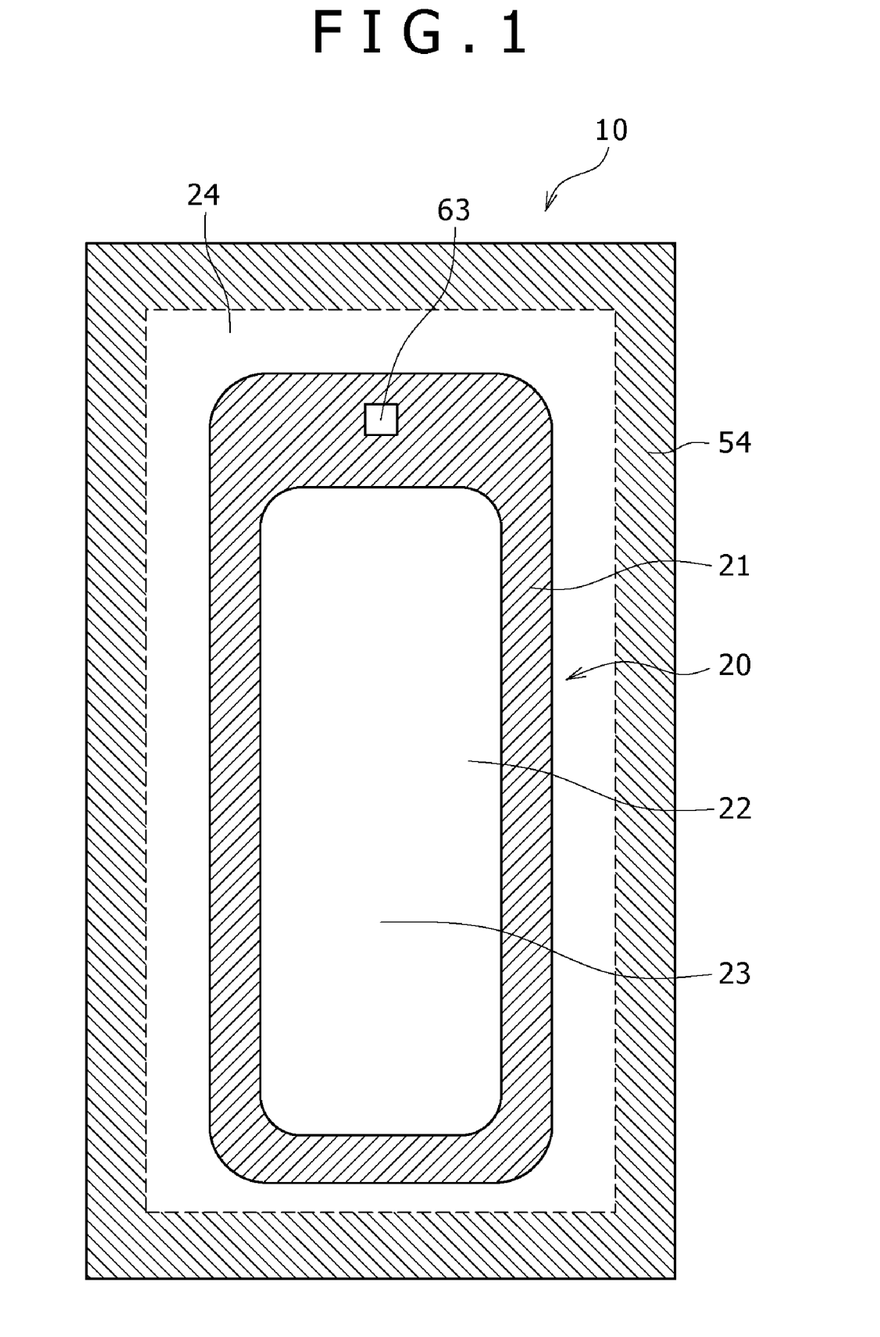
FIG. 1 is a plan view illustrating an organic EL display as an example of an active matrix display device of the present invention.

FIG. 1 is a plan view illustrating an organic EL display 10 as an example of an active matrix display device according to an embodiment of the present invention.

Figure 2:
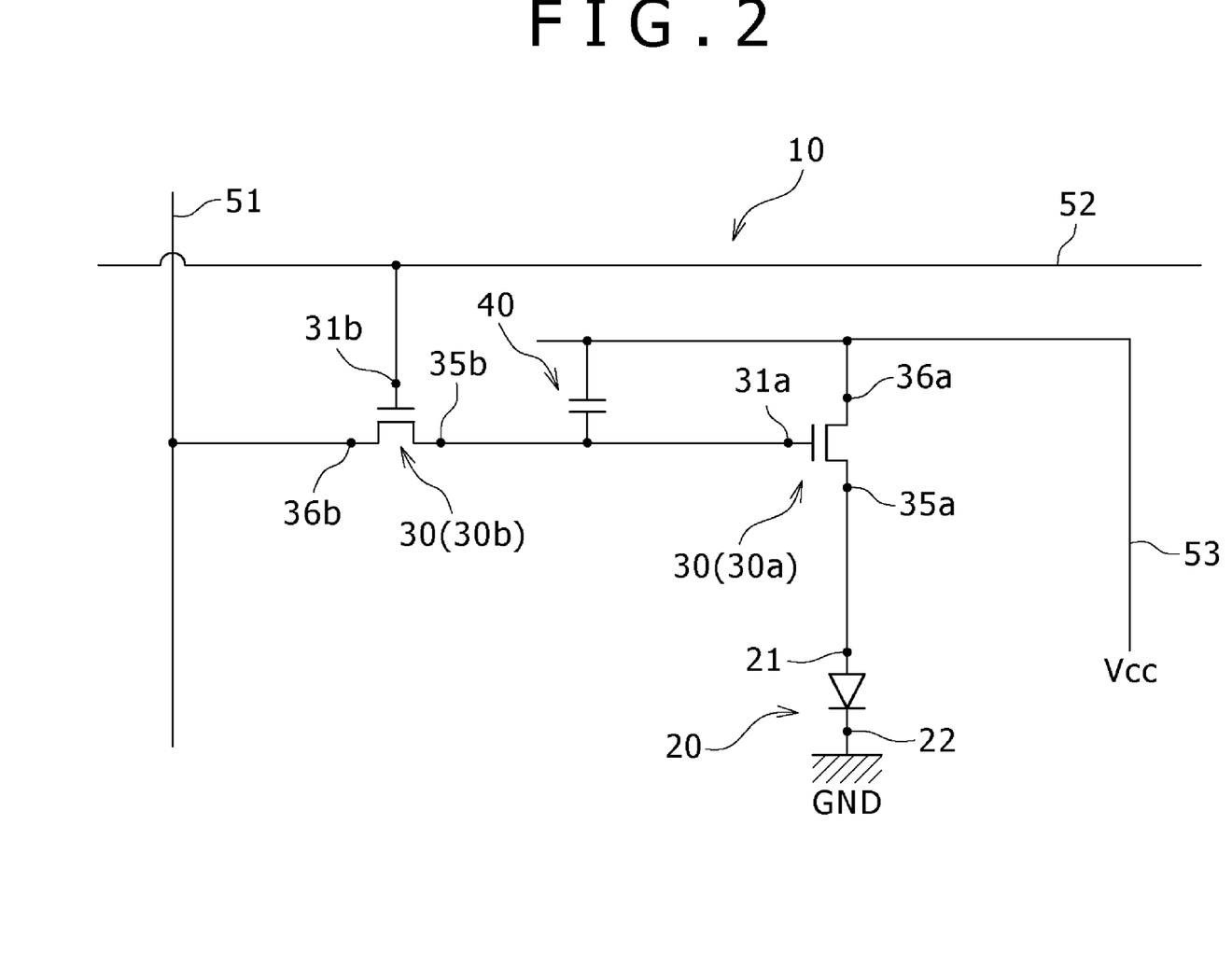
FIG. 2 is an equivalent circuit diagram of the organic EL display illustrated in FIG. 1.

FIG. 2 is an equivalent circuit diagram of the organic EL display 10 illustrated in FIG. 1.

As illustrated in FIG. 1, the organic EL display 10 includes organic EL elements 20. Each of the same elements 20 includes an anode electrode 21 (corresponds to the lower electrode in the present embodiment), cathode electrode 22 (corresponds to the upper electrode in the present embodiment) and organic substance layer 23. It should be noted that the cathode electrode 22 is a transparent electrode.

The organic EL element 20 is driven by TFTs 30 (TFT 30a and TFT 30b) and capacitor 40, illustrated in FIG. 2, which serve as a driving section of the present embodiment. That is, the organic EL display 10 includes, for example, the organic EL element 20, TFT 30a, TFT 30b and capacitor 40. The organic EL element 20 has the cathode electrode 22 connected to GND (ground). The TFT 30a has a source electrode 35a connected to the anode electrode 21 of the organic EL element 20 and a drain electrode 36a connected to a power line 53 at positive potential (Vcc). The capacitor 40 is connected between the gate electrode 31a of the TFT 30a and the power line 53. The TFT 30b has a source electrode 35b connected to the gate electrode 31a of the TFT 30a, a gate electrode 31b connected to a scan line 52, and a drain electrode 36b connected to a signal line 51.

In the organic EL display 10 configured as described above, the TFT 30a is a drive transistor and the TFT 30b a switching transistor. When a write signal is applied to the scan line 52 to control the potential of the gate electrode 31b of the TFT 30b, a signal voltage of the signal line 51 is applied to the gate electrode 31a of the TFT 30a. At this time, the potential of the gate electrode 31a is stably maintained by the capacitor 40 until the next time a write signal is applied to the scan line 52. During this time period, a current appropriate to the voltage between the gate electrode 31a and source electrode 35a of the TFT 30a flows through the organic EL element 20. This causes the same element 20 to continuously emit light at the brightness appropriate to the current level.

Here, light generated by the organic EL element 20 is extracted from the exposed portion (center portion) of an opening regulating insulating film 24 illustrated in FIG. 1. That is, the opening regulating insulating film 24 is provided around the anode electrode 21 and organic substance layer 23 and has an opening at the center portion. Therefore, light generated by the organic EL element 20 is emitted externally from the center portion of the opening regulating insulating film 24 through the transparent cathode electrode 22. It should be noted that an auxiliary wiring 54 is disposed in the opening regulating insulating film 24. The same wiring 54 is adapted to adjust the electrical resistance of the cathode electrode 22.

Figure 3:
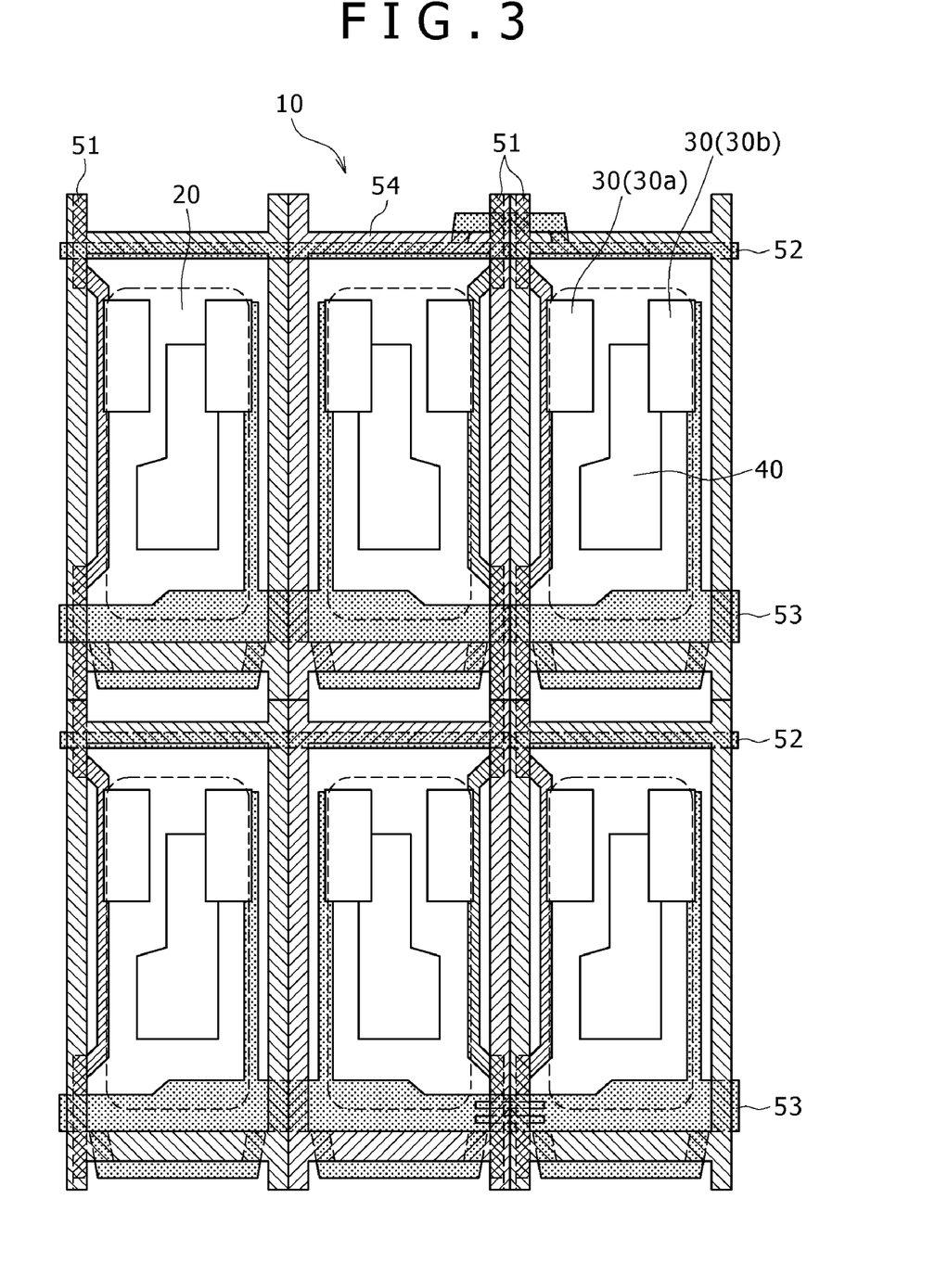
FIG. 3 is a plan view illustrating the wiring structure of the organic EL display as an example of the active matrix display device of the present invention.

FIG. 3 is a plan view illustrating the wiring structure of the organic EL display 10 according to the embodiment of the present invention as an example of the active matrix display device.

Figure 4:
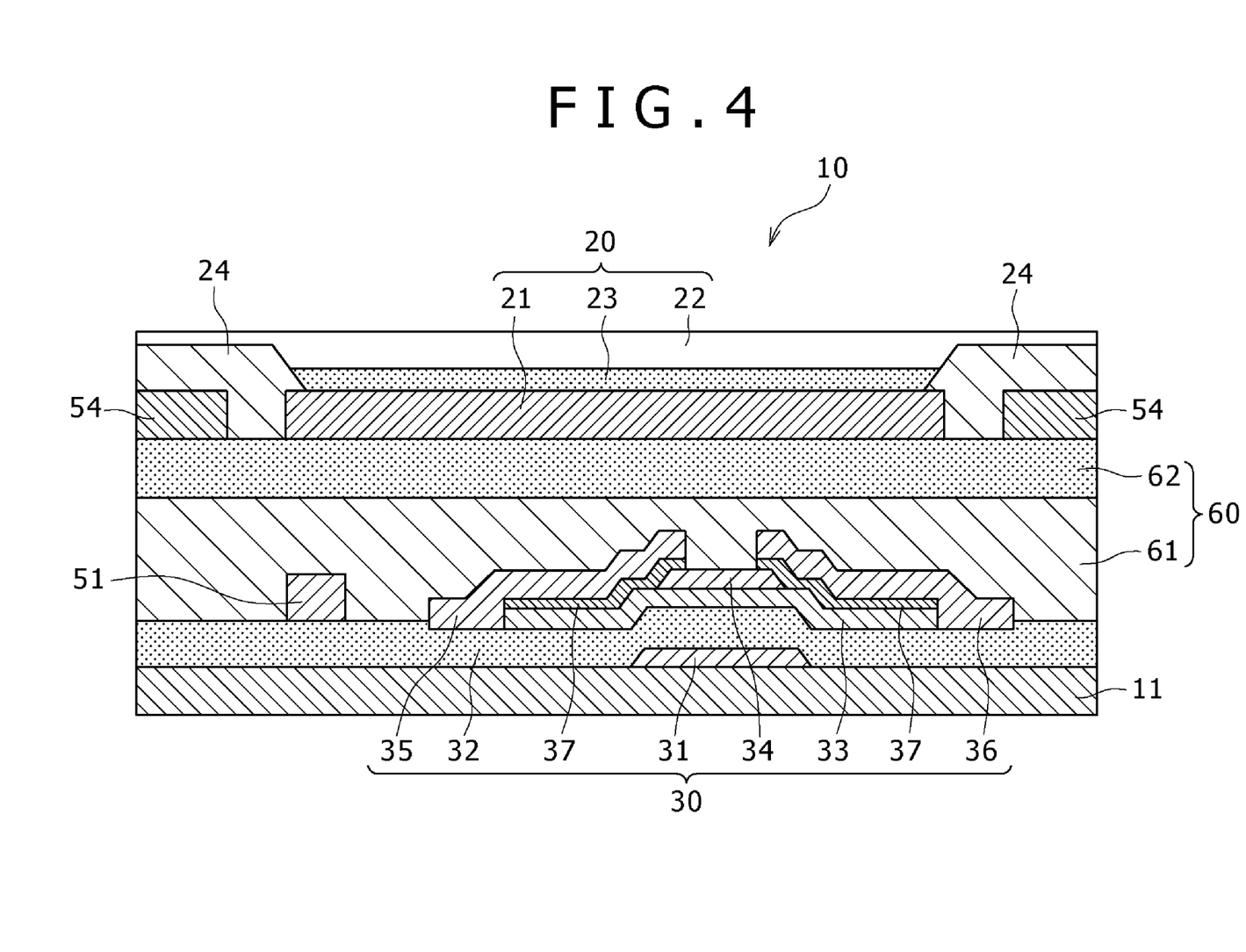
FIG. 4 is a sectional view of the organic EL display illustrated in FIG. 3 in the row direction (horizontal direction in FIG. 3)

FIG. 4 is a sectional view of the organic EL display 10 illustrated in FIG. 3 in the row direction (horizontal direction in FIG. 3).

As illustrated in FIG. 3, the organic EL display 10 has the organic EL elements 20 arranged in a matrix of M rows by N columns (two rows by three columns in FIG. 3 for simplification).

Here, the organic EL display 10 is an active matrix display device having, on a substrate 11 (refer to FIG. 4), TFTs (thin film transistors) 30 (TFT 30a and TFT 30b) adapted to drive the organic EL element 20 for each of the same elements 20. It should be noted that the capacitor 40 and other components are also provided on the substrate 11 in addition to the TFTs 30 (TFT 30a and TFT 30b).

The TFT 30 includes, as illustrated in FIG. 4, a gate insulating film 32, a-Si layer 33 and protective film 34 stacked on a gate electrode 31. The TFT 30 also includes a source electrode 35 on the left side of the a-Si layer 33 and a drain electrode 36 on the right side thereof. It should be noted that an n+ a-Si layer 37 containing an n-type impurity is provided to ensure excellent ohmic contact between the a-Si layer 33 and source electrode 35 or drain electrode 36.

In order to manufacture the TFT 30 as described above, the gate electrode 31 is formed first on the substrate 11 made, for example, of glass using a conductive material such as Mo (molybdenum). Next, the gate insulating film 32 is formed so as to cover the substrate 11 and gate electrode 31. Then, the a-Si layer 33 is formed on the gate insulating film 32 above the gate electrode 31. Then, the protective film 34 is formed at the center portion of the a-Si layer 33 (above the gate electrode 31). At the same time, the n+ a-Si layer 37 is formed on both sides of the center portion of the a-Si layer 33. Then, a metallic layer is formed, for example, with Al (aluminum) on the gate insulating film 32 and n+ a-Si layer 37, after which the metallic layer is patterned for use as the source electrode 35 and drain electrode 36.

Further, on the gate insulating film 32 is disposed the signal line 51 which is one of the drive wirings adapted to drive the organic EL element 20. In addition to the signal line 51, the scan line 52 and power line 53 as illustrated in FIG. 3 also serve as the drive wirings.

These drive wirings are patterned in an insulating film 60 and insulated from each other. That is, an insulating protective film 61 is disposed above the TFT 30, signal line 51 and other components. Then, an insulating planarizing film 62 is stacked on the insulating protective film 61 to form together the insulating film 60. It should be noted that the insulating planarizing film 62 is adapted to provide a flat surface free from irregularities on the insulating film 60.

Further, on the insulating planarizing film 62 is disposed the organic EL element 20. The same element 20 has the organic substance layer 23 between the anode electrode 21 and cathode electrode 22. The anode electrode 21 is connected to the TFT 30 via a connection hole 63 (refer to FIG. 1) formed in the insulating film 60. The organic substance layer 23 includes an organic substance adapted to emit light as a result of the recombination of injected electrons and holes.

Light emitted by the organic substance layer 23 is extracted from the center portion of the opening regulating insulating film 24 surrounding the anode electrode 21. That is, a metal having a high reflectance, for example, is used for the anode electrode 21. In contrast, the cathode electrode 22 is a transparent electrode made of a conductive material having a high transmittance. Therefore, light emitted by the organic substance layer 23 is extracted from the side opposite to the substrate 11. The top emission organic EL display 10 configured as described above is effective for delivering a high numerical aperture of the organic EL element 20.

Here, the conductive material having a high transmittance which makes up the cathode electrode 22 is high in resistance. In order to adjust the electrical resistance of the cathode electrode 22 to a reduced resistance, therefore, the auxiliary wiring 54 is connected to the cathode electrode 22. The same wiring 54 is disposed around the anode electrode 21. The same wiring 54 is at the same potential as the cathode electrode 22 and grounded, for example, to GND (refer to FIG. 2).

Further, the organic EL display 10 has the signal line 51 disposed for each column of the organic EL elements 20 arranged in a matrix, as illustrated in FIG. 3. The organic EL display 10 also has the scan line 52 disposed for each row (on top of each row) of the organic EL elements 20 and the power line 53 disposed for each row (at the bottom of each row) thereof. The signal, scan and power lines 51, 52 and 53 are disposed in the underlying layer of the auxiliary wiring 54 which is provided in the same layer as the anode electrode 21 (refer to FIG. 4). Therefore, the signal, scan and power lines 51, 52 and 53 and auxiliary wiring 54 overlap each other one above the other at some points.

The power line 53 disposed as described above is connected to positive potential (Vcc) as illustrated in FIG. 2. Because a voltage of several tens of volts may be applied, the power line 53 has the largest potential difference with the auxiliary wiring 54 connected to GND. This leads to a condition highly likely to produce a short circuit due to the potential difference between the power line 53 and auxiliary wiring 54 where these wirings overlap each other. In addition, the power line 53 is thick for reduced resistance to prevent voltage drop. This provides a larger area over which the power line 53 overlaps the auxiliary wiring 54, making it more likely to produce a short circuit. Further, the power line 53 is laid out in the entire organic EL display 10 with a single wiring. As a result, even a short circuit at a single location could significantly affect the light emission.

Further, if the signal line 151 is disposed below and along the auxiliary wiring 154 as with the existing organic EL display 110 illustrated in FIG. 7, the potential difference between an irregular potential applied to the signal line 151 and the potential of the auxiliary wiring 154 is likely to produce a short circuit between the auxiliary wiring 154 and signal line 151.

Particularly, upsizing of the organic EL display 10 leads to more frequent short-circuits, resulting in lower yield. As a result, a laser repair step is essential to repair the short-circuited area. That is, the manufacturing process of the organic EL display 10 includes an inspection step adapted to optically inspect for short-circuits and a repair step adapted to repair the detected short-circuited area by laser irradiation.

In the organic EL display 10 according to the present embodiment, therefore, the signal lines 51 is routed in a roundabout manner toward the inside where the same lines 51 overlap the auxiliary wiring 54 one above the other. As a result, the signal line 51 and auxiliary wiring 54 are disposed out of horizontal alignment with each other as illustrated in FIG. 4. Further, as illustrated in FIG. 3, the power line 53 is branched into two lines where the auxiliary wiring 54 and power line 53 overlap each other so that the auxiliary wiring 54 is sandwiched between the two branch lines of the power line 53.

Figure 5A:
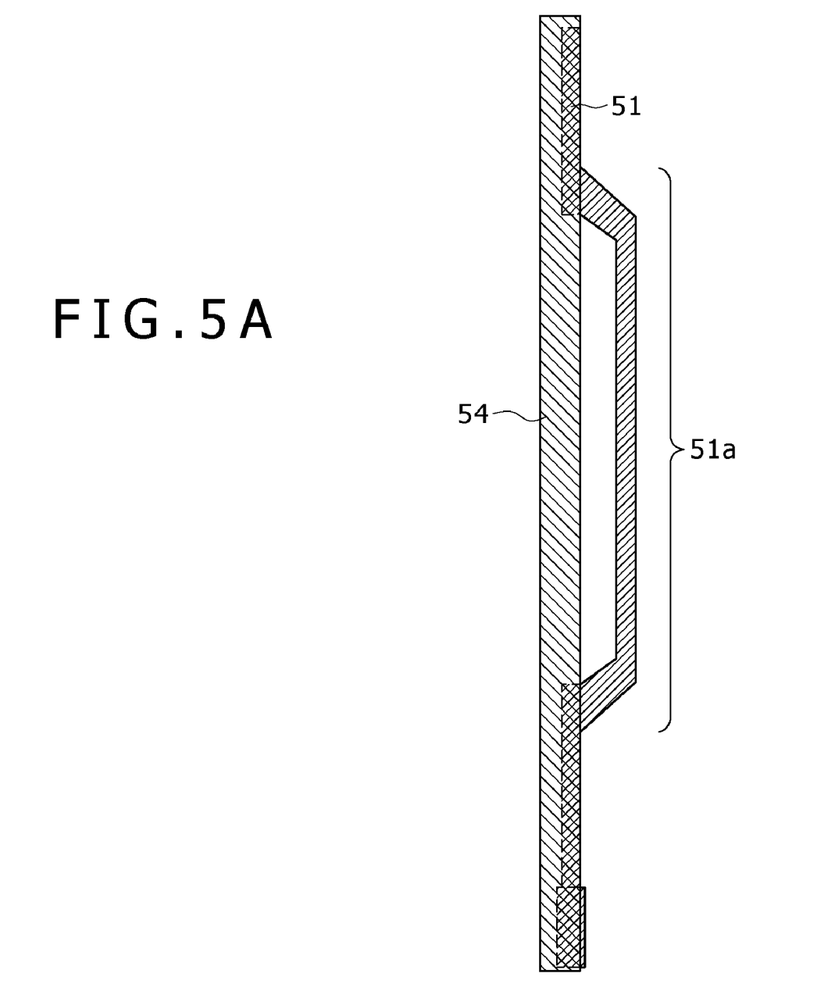
FIGS. 5A and 5B are plan views illustrating the positional relationship between the auxiliary wiring and signal line and that between the auxiliary wiring and power line in the organic EL display as an example of the active matrix display device of the present embodiment.
Figure 5B:
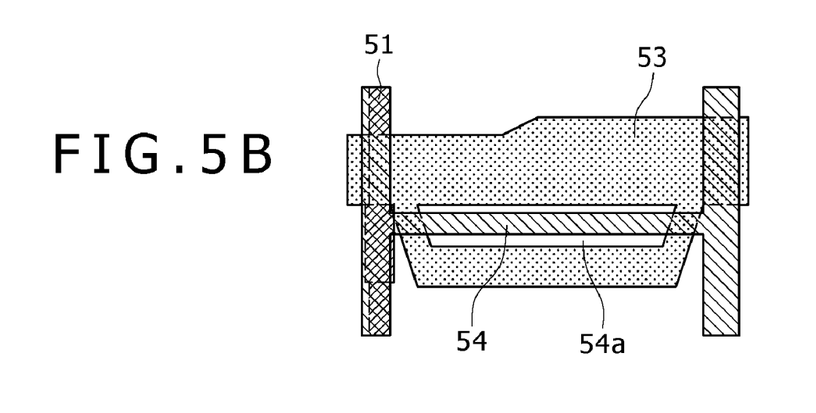

FIGS. 5A and 5B are plan views illustrating the positional relationship between the auxiliary wiring 54 and signal line 51 and that between the auxiliary wiring 54 and power line 53 in the organic EL display 10 as an example of the active matrix display device of the present embodiment.

The auxiliary wiring 54 and signal line 51 overlap each other when the signal line 51 is disposed linearly. As illustrated in FIG. 5A, a roundabout portion 51a is formed on the signal line 51. As a result, the signal line 51 is routed in a roundabout manner by the roundabout portion 51a where the auxiliary wiring 54 and signal line 51 overlap each other.

Here, at the roundabout portion 51a, the signal line 51 is disposed out of horizontal alignment with the auxiliary wiring 54. Therefore, the signal line 51 and auxiliary wiring 54 do not overlap each other. This suppresses short circuits between the signal line 51 and auxiliary wiring 54 even in the event of entry of a foreign object in the manufacturing process.

Here, as illustrated in FIG. 5B, the power line 53 is branched into two lines where the auxiliary wiring 54 and power line 53 overlap each other. A slit 54a is formed between the two branch lines of the power line 53. The auxiliary wiring 54 is disposed along the slit 54a. As a result, the power line 53 is routed in a roundabout manner to avoid the auxiliary wiring 54 where the auxiliary wiring 54 and power line 53 overlap each other.

Here, where the slit 54a is provided, the power line 53 is disposed out of horizontal alignment with the auxiliary wiring 54. Therefore, the power line 53 and auxiliary wiring 54 do not overlap each other. This suppresses short circuits between the power line 53 and auxiliary wiring 54 even in the event of entry of a foreign object in the manufacturing process.

As described above, in the entire organic EL display 10 according to the present embodiment, the signal line 51 is disposed out of horizontal alignment with the auxiliary wiring 54, and the power line 53 is similarly disposed out of horizontal alignment with the auxiliary wiring 54. This provides reduced overlap between the auxiliary wiring 54 and signal line 51 and between the auxiliary wiring 54 and power line 53. Therefore, short circuits between the two wirings are suppressed, thus permitting light emission of all the light-emitting elements arranged in a matrix in an almost positive manner. As a result, the yield of an active matrix display device can be improved.

Although a preferred embodiment of the present invention has been described herein, the present invention is not limited to the above but may be modified in various ways including the following:

(1) In the present embodiment, the signal line 51 is routed in a roundabout manner where the auxiliary wiring 54 and signal line 51 overlap each other, and the power line 53 is branched and routed in a roundabout manner where the auxiliary wiring 54 and power line 53 overlap each other. However, the present invention is not limited thereto, and the scan line 52 may be routed in a roundabout manner where the auxiliary wiring 54 and scan line 52 overlap each other.

(2) In the present embodiment, the signal and power lines 51 and 53 are routed in a roundabout manner. However, the auxiliary wiring 54 may be routed in a roundabout manner rather than the signal or power line 51 or 53. It should be noted that the auxiliary wiring 54 may be routed in a roundabout manner rather than the scan line 52 where the auxiliary wiring 54 and scan line 52 overlap each other.

(3) In the present embodiment, a description has been given of a top emission display designed to extract light, emitted by the organic EL element 20 (light-emitting element), from the side opposite to the substrate 11. However, the present invention is also applicable to a bottom emission display designed to extract light, emitted by the organic EL element 20 (light-emitting element), from the same side as the substrate 11.

(4) In the present embodiment, the a-Si (amorphous silicon) layer 33 is used for the TFTs 30 (TFT 30a and TFT 30b). However, a poly-Si (polysilicon) may be used for the TFTs 30. Further, in the present embodiments, the organic EL elements (organic electroluminescence elements) 20 are used as light-emitting elements. However, wide-ranging light-emitting elements such as inorganic electroluminescence elements or light-emitting diodes may be used so long as a light-emitting layer can be formed between the upper and lower electrodes.

What is claimed is:

1. An active matrix display device comprising:
    a plurality of driving means provided on a substrate;
    an insulating film stacked on the driving means; and
    light-emitting elements arranged in a matrix having rows and columns on the insulating film, each of the light-emitting elements having a light-emitting layer between upper and lower electrodes;
    the active matrix display device driven by the plurality of driving means with the driving means respectively provided for each of the light-emitting elements, the active matrix display device also including
    a) an auxiliary wiring provided on the same layer as the lower electrode of the light-emitting element and adapted to adjust electrical resistance of the upper electrode, and
    b) a drive wiring disposed in an underlying layer of the auxiliary wiring via the insulating film and adapted to drive the light-emitting element,
    wherein,
    one of the auxiliary wiring and the drive wiring is routed such with respect to the other of the auxiliary wiring and the drive wiring to avoid an overlap with the other wiring over a common extent of the wirings.

2. The active matrix display device of claim 1, wherein the light-emitting elements are organic electroluminescence elements having an organic substance layer.

3. The active matrix display device of claim 1, wherein the auxiliary wiring is disposed around the light-emitting element and connected to the upper electrode to reduce the electrical resistance of the upper electrode.

4. The active matrix display device of claim 1, wherein:
    the drive wiring includes at least one of a signal line disposed for each column of the matrix, a scan line disposed for each row of the matrix, and
    a power line disposed for each row of the matrix.

5. The active matrix display device of claim 1, wherein the drive wiring is routed such that the drive wiring is disposed out of horizontal alignment with the auxiliary wiring, a horizontal direction being a direction along a row of the matrix.

* * * * *